(12) United States Patent
Kubota

(10) Patent No.: US 7,087,357 B2
(45) Date of Patent: Aug. 8, 2006

(54) PHOTOREACTIVE RESIN COMPOSITION, METHOD FOR MAKING CIRCUIT SUBSTRATE USING SAME, AND METHOD FOR MAKING CERAMIC MULTILAYER SUBSTRATE USING SAME

(75) Inventor: Masahiro Kubota, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 95 days.

(21) Appl. No.: 10/751,444

(22) Filed: Jan. 6, 2004

(65) Prior Publication Data

US 2004/0154726 A1 Aug. 12, 2004

(30) Foreign Application Priority Data

Feb. 12, 2003 (JP) .............................. 2003-033856

(51) Int. Cl.
*G03F 7/004* (2006.01)
*G03F 7/031* (2006.01)
*G03F 7/033* (2006.01)

(52) U.S. Cl. .............................. 430/270.1; 430/281.1; 430/288.1

(58) Field of Classification Search ............. 430/270.1, 430/281.1, 288.1
See application file for complete search history.

(56) References Cited

U.S. PATENT DOCUMENTS

| 5,032,478 | A | * | 7/1991 | Nebe et al. ............... 430/281.1 |
| 5,032,490 | A | * | 7/1991 | Nebe et al. ............... 430/281.1 |
| 5,047,313 | A | * | 9/1991 | Nebe et al. ............... 430/281.1 |
| 6,531,257 | B1 | * | 3/2003 | Kubota ........................ 430/198 |
| 6,630,287 | B1 | * | 10/2003 | Towata ........................ 430/311 |
| 6,727,034 | B1 | * | 4/2004 | Ogiso et al. ................ 430/176 |
| 6,806,028 | B1 | * | 10/2004 | Kubota .................... 430/270.1 |
| 2002/0033565 | A1 | * | 3/2002 | Hayashi ...................... 264/621 |
| 2003/0036020 | A1 | | 2/2003 | Kubota |
| 2003/0143486 | A1 | * | 7/2003 | Kubota et al. ........... 430/281.1 |

FOREIGN PATENT DOCUMENTS

| JP | 05-067405 | 3/1993 |
| JP | 07-286032 | 10/1995 |
| JP | 2000-277887 | 10/2000 |

* cited by examiner

*Primary Examiner*—John S. Chu
(74) *Attorney, Agent, or Firm*—Dickstein, Shapiro, Morin & Oshinsky, LLP.

(57) ABSTRACT

A photoreactive resin composition contains (a) a powdered base metal, (b) an organic binder, (c) a photosensitive organic component, and (d) a polycarboxylic acid-based dispersing agent with a molecular weight of about 1,500 or less. Also disclosed is a method for making a circuit substrate or a ceramic multilayer substrate including the step of forming a conductive pattern using the photoreactive resin composition.

8 Claims, 3 Drawing Sheets

PHOTOREACTIVE RESIN COMPOSITION, METHOD FOR MAKING CIRCUIT SUBSTRATE USING SAME, AND METHOD FOR MAKING CERAMIC MULTILAYER SUBSTRATE USING SAME

BACKGROUND OF THE INVENTION

1. Field of the Invention

The present invention relates to photoreactive resin compositions which are used for forming conductive patterns, methods for making circuit substrates in which conductive films are formed using the photoreactive resin compositions, and methods for making ceramic multilayer substrates in which conductive films are formed using the photoreactive resin compositions.

2. Description of the Related Art

Recently, miniaturization and improved performance have been strongly required for high-frequency electronic components used for mobile communication apparatuses, satellite broadcast receivers, computers, etc. With respect to the wiring patterns of high-frequency electronic components, higher wiring density and higher signal transmission speed have been demanded. In order to achieve such higher wiring density and higher signal transmission speed, finer wiring patterns must be formed and the thickness of wiring patterns must be increased.

In order to form fine thick wiring patterns, photolithography using a photoreactive resin composition is effectively employed. In a photolithographic process, a photoreactive resin composition containing a powdered inorganic component (powdered conductive metal for forming wiring patterns or powdered glass for forming via-holes) and a photoreactive organic component including an alkali-soluble polymer, a monomer having an ethylenically unsaturated double bond, a photoreaction initiator, etc., is applied onto a substrate and is then dried. Subsequently, patterning is performed by exposure through a mask, followed by development with an alkaline developer, and then firing is performed to form a wiring pattern with a predetermined shape. An example of photolithographic processes is disclosed in Japanese Unexamined Patent Application Publication No. 5-67405.

However, when such a photoreactive resin composition is exposed and developed, extraneous matter remaining on the substrate, i.e., residue after development, gives rise to a problem. In particular, when a powdered base metal is incorporated in the photoreactive resin composition, it is not possible to prevent a residue after development due to aggregation of the powdered base metal.

SUMMARY OF THE INVENTION

It is an object of the present invention to provide a photoreactive resin composition in which aggregation of powdered base metal does not easily occur.

In one aspect of the present invention, the photoreactive resin composition contains (a) a powdered base metal, (b) an organic binder, (c) a photosensitive organic component, and (d) a polycarboxylic acid-based dispersing agent with a molecular weight of about 1,500 or less.

In the photoreactive resin composition, preferably, the molecular weight of the organic binder is about 10,000 or more. Preferably, the photoreactive resin composition contains about 0.05 to 0.8 parts by weight of the polycarboxylic acid-based dispersing agent relative to 100 parts by weight of the powdered base metal. Preferably, the photoreactive resin composition further contains a polyvalent alcohol and a thixotropic agent.

In another aspect of the present invention, a method for making a circuit substrate includes the step of forming a conductive pattern using the photoreactive resin composition.

In yet another aspect of the present invention, a method for making a circuit substrate includes the steps of applying the photoreactive resin composition onto a support, exposing and developing the photoreactive resin composition to form a predetermined conductive pattern on the support, transferring the conductive pattern formed on the support to a substrate, and firing the conductive pattern.

In a further aspect of the present invention, a method for making a ceramic multilayer substrate includes the steps of applying the photoreactive resin composition onto a support, exposing and developing the photoreactive resin composition to form a predetermined conductive pattern on the support, transferring the conductive pattern formed on the support to a ceramic green sheet; stacking a plurality of the ceramic green sheets provided with the conductive patterns to form a laminate, and firing the laminate.

DESCRIPTION OF THE PREFERRED EMBODIMENTS

Figure 1A:
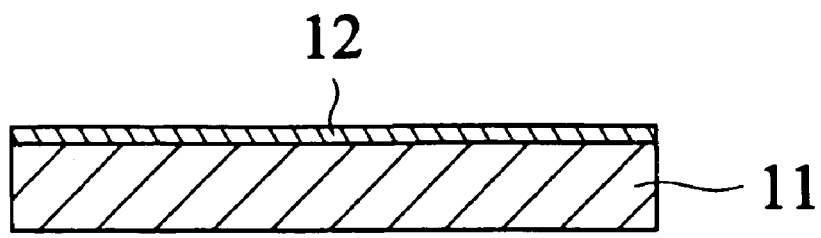
FIGS. 1A to 1D are cross-sectional views which show the steps in a method for making a circuit substrate in one embodiment of the present invention.

Components (a) to (d) constituting a photoreactive resin composition of the present invention will be described below.

(a) Powdered Base Metal

As the powdered base metal, Cu, Mo, Ni, W or an alloy containing at least one of these metals may be used. The powdered base metal is preferably spherical. Preferably, the powdered base metal has an average particle diameter $d_{50}$ of about 1 to 5 μm and a specific surface area of about 0.1 to 2.0 $m^2/g$. If the conditions described above are satisfied, conductive patterns are particularly easily formed.

The surface of the powdered base metal may be subjected to an oxidation treatment. In order to oxidize the surface of powdered base metal, a method may be used in which the powdered base metal is heated to a temperature higher than room temperature in an oxygen-containing atmosphere or maintained at room temperature in such an atmosphere. In this method, the state of the base metal oxide on the surface of the powdered base metal can be easily controlled, and it is possible to form a dense base metal oxide film on the surface of the powdered base metal.

(b) Organic Binder

Preferably, the photoreactive resin composition can be developed with water or an aqueous alkaline solution, based on environmental considerations. Accordingly, the organic binder preferably has acidic functional groups, which liberate protons. Examples of the organic binder which may be used include carboxyl group-containing acrylic copolymers.

A carboxyl group-containing copolymer may be produced, for example, by copolymerizing an unsaturated carboxylic acid and an ethylenically unsaturated compound. Examples of unsaturated carboxylic acids include acrylic acid, methacrylic acid, maleic acid, fumaric acid, vinyl acetic acid, and the anhydrides thereof. Examples of ethylenically unsaturated compounds include acrylic esters, such as methyl acrylate and ethyl acrylate; methacrylic esters, such as methyl methacrylate and ethyl methacrylate; and fumaric esters, such as monoethyl fumarate.

Acrylic copolymers having unsaturated bonds in the forms described below may also be used.

1) A material prepared by the addition reaction between the carboxyl group in a side chain of the acrylic copolymer and an acrylic monomer having a functional group, such as an epoxy group, which is reactive with the carboxyl group.

2) A material prepared by performing a reaction between an acrylic copolymer having an epoxy group instead of the carboxyl group in a side chain and an unsaturated monocarboxylic acid, and then introducing a saturated or unsaturated polyvalent carboxylic anhydride to the acrylic copolymer.

Preferably, the molecular weight of the organic binder is about 10,000 or more. If the molecular weight is less than about 10,000, photo-curing may become insufficient. Consequently, conductive patterns may flow away from their desired position during development, or patterns may be partially detached because removal of exposed areas due to development becomes excessive, resulting in pattern defects.

Preferably, the molecular weight of the organic binder is about 60,000 or less. If the molecular weight exceeds about 60,000, the size of gels produced by reaction between the organic binder and the powdered base metal easily become huge, and the entire composition may be gelated quickly.

(c) Photosensitive Organic Component

The photosensitive organic component comprises a known photopolymerizable or photomodifiable compound. Examples thereof include:

1) a mixture of a monomer or an oligomer having a reactive functional group, such as an unsaturated group, and a photo-radical generator, such as an aromatic carbonyl compound;

2) a so-called diazo resin, such as a condensate of an aromatic bisazide and formaldehyde;

3) a mixture of an addition polymerizable compound, such as an epoxy compound, and a photo-acid generator, such as a diaryliodonium salt; and 4) a naphthoquinonediazide compound.

Among those photosensitive organic components, particularly preferred is the mixture of a monomer or an oligomer having a reactive functional group, such as an unsaturated group, and a photo-radical generator, such as an aromatic carbonyl compound.

Examples of photo-radical generators which may be used include benzil, benzoin ethyl ether, benzoin isobutyl ether, benzoin isopropyl ether, benzophenone, benzoylbenzoic acid, methyl benzoylbenzoate, 4-benzoyl-4'-methyl diphenyl sulfide, benzyl dimethyl ketal, 2-n-butoxy-4-dimethyl aminobenzoate, 2-chlorothioxanthone, 2,4-diethyl thioxanthone, 2,4-diisopropyl thioxanthone, isopropyl thioxanthone, 2-dimethyl aminoethyl benzoate, p-dimethyl ethyl aminobenzoate, p-dimethyl isoamyl aminobenzoate, 3,3'-dimethyl-4-methoxy benzophenone, 2,4-dimethyl thioxanthone, 1-(4-dodecylphenyl)-2-hydroxy-2-methylpropane-1-one, 2,2-dimethoxy-1,2-diphenylethane-1-one, hydroxycyclohexyl phenyl ketone, 2-hydroxy-2-methylpropane-1-one, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, and bis(2,4,6-trimethyl benzoyl)phenylphosphine oxide.

Examples of monomers or oligomers having reactive functional groups include hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonyl phenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl)isocyanurate triacrylate, ethoxylated trimethylolpropane triacrylate, pentaerythritol triacrylate, propoxylated trimethylolpropane triacrylate, propoxylated glycerol triacrylate, pentaerythritol tetraacrylate, ditrimethylolpropane tetraacrylate, dipentaerythritolhydroxy pentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate, and trimethylolpropane trimethacrylate.

(d) Polycarboxylic Acid-Based Dispersing Agent

The polycarboxylic acid-based dispersing agent suppresses aggregation of the powdered base metal. The reason for this is believed to be that the polycarboxylic acid-based dispersing agent easily reacts with the powdered base metal and the surface of the powdered base metal is sufficiently coated with the polycarboxylic acid-based dispersing agent. Consequently, residue after development does not easily occur in the photoreactive resin composition of the present invention, and it is possible to stably form fine thick film patterns.

The molecular weight of the polycarboxylic acid-based dispersing agent is about 1,500 or less. If the molecular weight exceeds about 1,500, the function to suppress aggregation of the powdered base metal is weakened, which is undesirable. As is obvious from the definition that the molecular weight (weight average) is about 1,500 or less, the polycarboxylic acid-based dispersing agent is distinguished from the polycarboxylic acid-based organic binder.

Preferably, the polycarboxylic acid-based dispersing agent content is about 0.05 to 0.8 parts by weight relative to 100 parts by weight of the powdered base metal. If the content is less than about 0.05 parts by weight, the function to suppress aggregation of the powdered base metal is weakened. If the content exceeds about 0.8 parts by weight, removal of exposed areas due to development becomes excessive, and patterns may be partially detached, resulting in pattern defects.

(e) Other Components

Preferably, the photoreactive resin composition of the present invention further contains an ultraviolet absorber. By incorporating the ultraviolet absorber, unsatisfactory exposure due to light scattering can be suppressed. As the ultraviolet absorber, for example, an azo-based red pigment or an amine-based red dye may be used.

An inorganic component, such as powdered glass or powdered ceramic, may be present in the photoreactive resin composition of the present invention. Thereby, adhesion to the substrate can be improved. As the powdered glass, known powdered glass, such as borosilicate glass, may be used. As the powdered ceramic, alumina, zirconia or other known low-temperature sinterable powdered ceramic, such as crystallized glass-based ceramic, glass composite-based ceramic, or non-glass ceramic, may be used.

The photoreactive resin composition of the present invention may further contain a storage stabilizer, such as a polymerization inhibitor, an oxidation inhibitor, a dye, a pigment, an anti-foaming agent, a surfactant, etc., when necessary or desired.

A method for making a circuit substrate using the photoreactive resin composition of the present invention in an embodiment will be described below.

First, as shown in FIG. 1A, a photoreactive resin composition 12 of the present invention is applied to a principal surface of a substrate 11. As the substrate 11, for example, an alumina substrate may be used. In order to apply the photoreactive resin composition 12, for example, screen-printing or spin coating may be used.

Figure 1B:
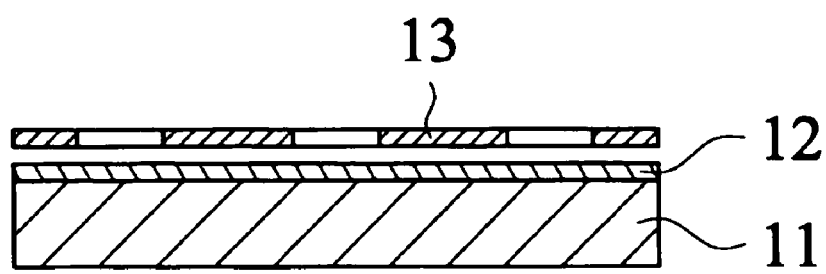

As shown in FIG. 1B, a photomask 13 having a predetermined pattern is positioned on the layer of the photoreactive resin composition 12 and exposure is then performed. As the exposure device, for example, a high-pressure mercury-vapor lamp or a metal halide lamp may be used.

Figure 1C:
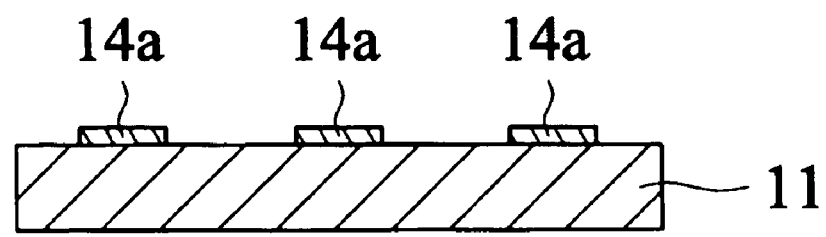

Next, as shown in FIG. 1C, the photoreactive resin composition 12 is developed with an aqueous alkaline solution to form conductive patterns 14a. As the aqueous alkaline solution, for example, an aqueous sodium carbonate solution, an aqueous monoethanolamine solution, or an aqueous triethanolamine solution may be used.

Figure 1D:
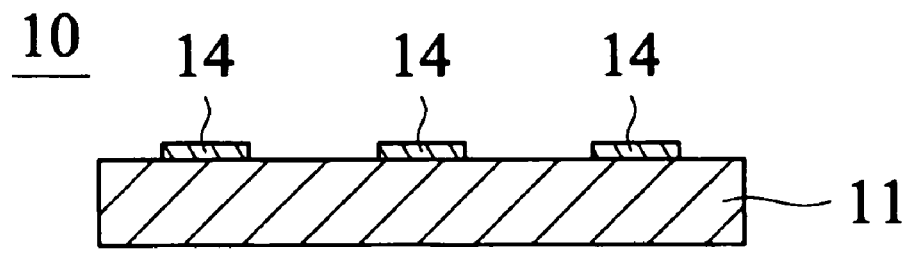

The powdered base metal contained in the conductive patterns 14a is then sintered by a heat treatment, and thereby wiring conductors 14 are formed on the principal surface of the substrate 11 as shown in FIG. 1D. A circuit substrate 10 is produced by the steps described above.

A method for making a circuit substrate using the photoreactive resin composition of the present invention in another embodiment will be described below.

Figure 2A:
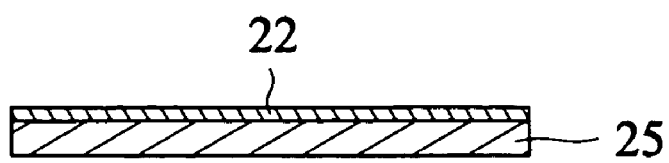
FIGS. 2A to 2F are cross-sectional views which show the steps in a method for making a circuit substrate in another embodiment of the present invention.

First, as shown in FIG. 2A, a photoreactive resin composition 22 of the present invention is applied onto a support 25. As the support 25, for example, a polyethylene terephthalate (PET) film or a polyethylene terenaphthalate (PEN) film may be used.

Figure 2B:
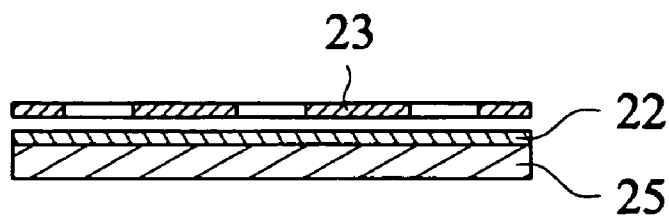
Figure 2C:
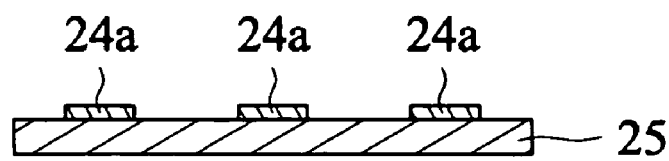

As shown in FIG. 2B, a photomask 23 having a predetermined pattern is positioned on the layer of the photoreactive resin composition 22, and exposure is then performed. Subsequently, as shown in FIG. 2C, the photoreactive resin composition 22 is developed with an aqueous alkaline solution to form conductive patterns 24a.

Figure 2D:
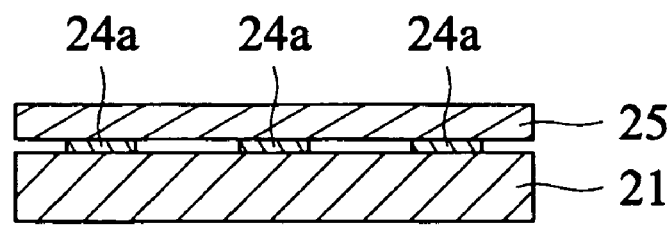
Figure 2E:
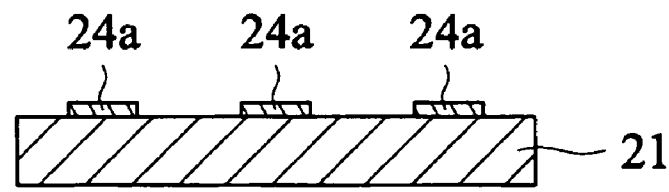

Next, as shown in FIG. 2D, the support 25 is placed on a substrate 21 in such a manner that the conductive patterns 24a are in contact with a principal surface of the substrate 21, and press-bonding is performed. By removing the support 25 from the substrate 21, the conductive patterns 24a are transferred to the principal surface of the substrate 21 as shown in FIG. 2E.

Figure 2F:
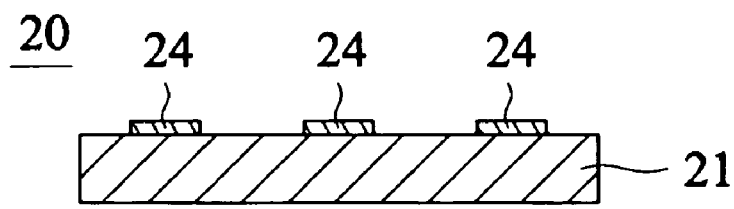

The powdered base metal contained in the conductive patterns 24a is then sintered by a heat treatment, and thereby wiring conductors 24 are formed on the principal surface of the substrate 21 as shown in FIG. 2F. A circuit substrate 20 is produced by the steps described above. Since the other structures and processes are the same as those in Second Embodiment, the descriptions thereof will be omitted.

A method for making a ceramic multilayer substrate using the photoreactive resin composition of the present invention in another embodiment will be described below.

Figure 3A:
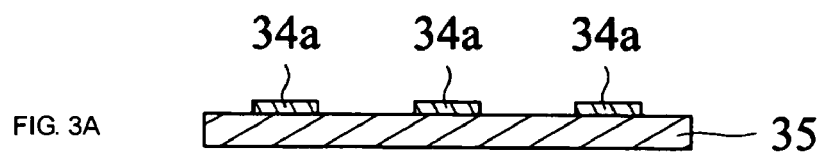
FIGS. 3A to 3E are cross-sectional views which show the steps in a method for making a ceramic multilayer substrate in an embodiment of the present invention.

First, as shown in FIG. 3A, as in the previous embodiment, conductive patterns 34a are formed on a support 35.

Figure 3B:
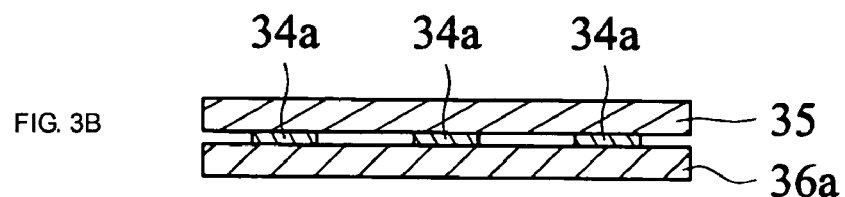
Figure 3C:
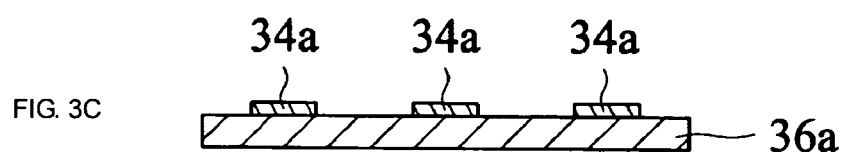

Next, as shown in FIG. 3B, the support 35 is placed on a ceramic green sheet 36a in such a manner that the conductive patterns 34a are in contact with a principal surface of the ceramic green sheet 36a, and press-bonding is performed. By removing the support 35 from the ceramic green sheet 36a, the conductive patterns 34a are transferred to the principal surface of the ceramic green sheet 36a as shown in FIG. 3C. In order to form the ceramic green sheet 36a, for example, a ceramic slurry which is obtained by mixing powdered alumina and powdered borosilicate glass into an organic vehicle may be molded into a sheet.

Figure 3D:
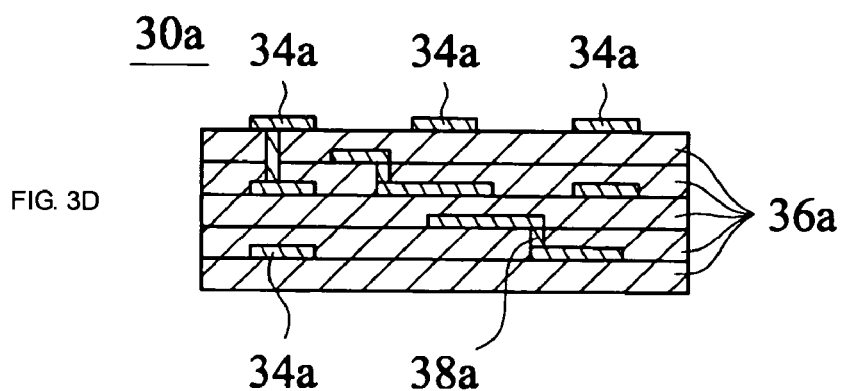
Figure 3E:
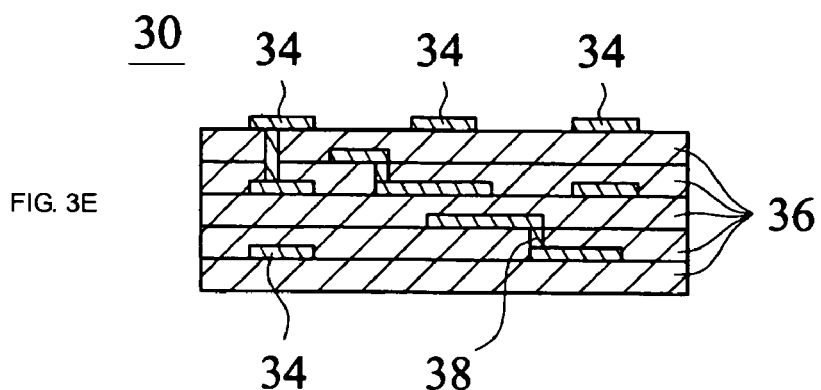

Subsequently, as shown in FIG. 3D, a plurality of the ceramic green sheets 36a provided with the transferred conductive patterns 34a are press-bonded to produce a laminate 30a. Through-holes are formed in the thickness direction of some of the ceramic green sheets 36a, and the through-holes are filled with a conductive paste 38a for via-hole conductors. The laminate 30a is then fired, and thereby a ceramic multilayer substrate 30 provided with a plurality of ceramic layers 36, wiring conductors 34, and via-hole conductors 38 is produced as shown in FIG. 3E.

EXAMPLES

Photoreactive resin compositions were prepared and evaluated as described below.

1. Preparation of Photoreactive Resin Compositions

In this example, the following materials were used.

(a) Powdered Base Metal

Powdered copper subjected to oxidation treatment on the surface thereof at 200° C. and 70% RH in an air atmosphere.

(Oxygen content: 0.5% by weight, average particle diameter: 3 μm, spherical shape)

(b) Organic Binder

Organic binder $a_1$: An ethylenically unsaturated double bond-containing acrylic copolymer produced by forming a copolymer of methacrylic acid and methyl methacrylate and by performing an addition reaction between the copolymer thus formed and epoxycyclohexylmethyl methacrylate in an amount of 0.2 times that of the methacrylic acid on a molar basis. (Acid value=118, molecular weight $M_w$=19,000).

Organic binder $a_2$: An acrylic copolymer produced by the same method as in the organic binder $a_1$ but molecular weight $M_w$=12,000.

Organic binder $a_3$: An acrylic copolymer produced by the same method as in the organic binder $a_1$ but molecular weight Mw=7,000.

(c) Photosensitive Organic Component

Monomer: Ethoxylated trimethylolpropane triacrylate

Photo-radical generator a: 2-methyl-1-[4-(methylthio)phenyl]-2-morpholinopropane-1-one Photo-radical generator b: 2,4-diethyl thioxanthone (d) Dispersing Agent Dispersing agent $a_1$: FLOWLEN G600 (manufactured by KYOEISHA CHEMICAL Co., LTD, polycarboxylic acid-based, molecular weight $M_w$=860)

Dispersing agent $a_2$: FLOWLEN G700 (manufactured by KYOEISHA CHEMICAL Co., LTD, polycarboxylic acid-based, molecular weight $M_w$=230)

Dispersing agent $a_3$: FLOWLEN G820 (manufactured by KYOEISHA CHEMICAL Co., LTD, polycarboxylic acid-based, molecular weight $M_w$=1,300)

Dispersing agent $a_4$: DISPARLON 2150 (manufactured by Kusumoto Chemicals, Ltd., polycarboxylic acid-based, molecular weight $M_w$=1,600)

Dispersing agent $a_5$: DISPARLON 1210 (manufactured by Kusumoto Chemicals, Ltd., polycarboxylic acid-based, molecular weight $M_w$=1,900)

Dispersing agent b: sorbitan laurate
Dispersing agent c: polyvinyl pyrrolidone (K value=30)
(e) Other Components
Organic solvent a: dipropylene glycol monomethyl ether
Organic solvent b: pentamethylene glycol
Polyvalent alcohol: glucitol
Ultraviolet absorber: Azo-based red dye
Thixotropic agent: DISPARLON 3600N (manufactured by Kusumoto Chemicals, Ltd., solid content: 50%)
Powdered glass: $SiO_2$—$Bi_2O_3$—$B_2O_3$ glass, average particle diameter: 3 μm, spherical shape The materials described above were weighed so as to satisfy the weight ratios shown in Tables 1 and 2 below, mixed, and compounded by a three-roll mill. Samples 1 to 18 of photoreactive resin compositions were thereby prepared.

2. Evaluation of Photoreactive Resin Compositions (1) Evaluation of Pattern Accuracy Three weeks after being prepared, the photoreactive resin of each of samples 1 to 18 was applied onto a PET film by screen-printing and was dried for 1 hour to form a coated film with a thickness of 10 μm. The PET film provided with the coated film was irradiated with active rays from a high-pressure mercury-vapor lamp at an exposure of 200 $mJ/cm^2$ through a photomask provided with patterns with a line width of 20 μm and a line pitch of 20 μm. Next, development was performed with an aqueous sodium carbonate solution, and thereby copper patterns with a line width of 20 μm and a line pitch of 20 μm were formed on the PET film.

With respect to 100 copper pattern lines in total, the number of patterns in which a residue after development remained due to aggregation of powdered copper (pattern residue ratio) and the number of patterns which were partially removed (pattern defect ratio) were determined. The results thereof are shown in Tables 1 and 2. With respect to sample 9 in Table 1, the population observed consisted of 62 lines when the residue pattern ratio and the defective pattern ratio were determined, since 38 lines of copper patterns flowed out during development.

TABLE 1

|  | Sample 1 | Sample 2 | Sample 3 | Sample 4* | Sample 5* | Sample 6* | Sample 7* | Sample 8 | Sample 9 |
| --- | --- | --- | --- | --- | --- | --- | --- | --- | --- |
| Powdered copper (g) | 110.00 | 110.00 | 110.00 | 110.00 | 110.00 | 110.00 | 110.00 | 110.00 | 110.00 |
| Organic binder $a_1$ (g) | 6.00 | 6.00 | 6.00 | 6.00 | 6.00 | 6.00 | 6.00 | — | — |
| Organic binder $a_2$ (g) | — | — | — | — | — | — | — | 6.00 | — |
| Organic binder $a_3$ (g) | — | — | — | — | — | — | — | — | 6.00 |
| Monomer (g) | 6.00 | 6.00 | 6.00 | 6.00 | 6.00 | 6.00 | 6.00 | 6.00 | 6.00 |
| Photo-radical generator a (g) | 1.00 | 1.00 | 1.00 | 1.00 | 1.00 | 1.00 | 1.00 | 1.00 | 1.00 |
| Photo-radical generator b (g) | 0.10 | 0.10 | 0.10 | 0.10 | 0.10 | 0.10 | 0.10 | 0.10 | 0.10 |
| Dispersing agent $a_1$ (g) | 0.11 | — | — | — | — | — | — | 0.11 | 0.11 |
| Dispersing agent $a_2$ (g) | — | 0.11 | — | — | — | — | — | — | — |
| Dispersing agent $a_3$ (g) | — | — | 0.11 | — | — | — | — | — | — |
| Dispersing agent $a_4$ (g) | — | — | — | 0.11 | — | — | — | — | — |
| Dispersing agent $a_5$ (g) | — | — | — | — | 0.11 | — | — | — | — |
| Dispersing agent b (g) | — | — | — | — | — | 0.11 | — | — | — |
| Dispersing agent c (g) | — | — | — | — | — | — | 0.11 | — | — |
| Organic solvent a (g) | 15.00 | 15.00 | 15.00 | 15.00 | 15.00 | 15.00 | 15.00 | 15.00 | 15.00 |
| Organic solvent b (g) | 15.00 | 15.00 | 15.00 | 15.00 | 15.00 | 15.00 | 15.00 | 15.00 | 15.00 |
| Polyvalent alcohol (g) | 1.00 | 1.00 | 1.00 | 1.00 | 1.00 | 1.00 | 1.00 | 1.00 | 1.00 |
| Ultraviolet absorber (g) | 0.10 | 0.10 | 0.10 | 0.10 | 0.10 | 0.10 | 0.10 | 0.10 | 0.10 |
| Thixotropic agent (g) | 0.50 | 0.50 | 0.50 | 0.50 | 0.50 | 0.50 | 0.50 | 0.50 | 0.50 |
| Powdered glass (g) | 3.40 | 3.40 | 3.40 | 3.40 | 3.40 | 3.40 | 3.40 | 3.40 | 3.40 |
| Pattern residue ratio | 1/100 | 1/100 | 1/100 | 88/100 | 90/100 | 100/100 | 100/100 | 1/100 | 1/62 |
| Pattern defect ratio | 0/100 | 0/100 | 0/100 | 0/100 | 0/100 | 0/100 | 0/100 | 0/100 | 30/62 |

*Out of the ranges of the present invention

TABLE 2

|  | Sample 10* | Sample 11* | Sample 12 | Sample 13 | Sample 14 | Sample 15 | Sample 16* |
| --- | --- | --- | --- | --- | --- | --- | --- |
| Powdered copper (g) | 110.00 | 110.00 | 110.00 | 110.00 | 110.00 | 110.00 | 110.00 |
| Organic binder $a_1$ (g) | 6.00 | 6.00 | 6.00 | 6.00 | 6.00 | 6.00 | 6.00 |
| Organic binder $a_2$ (g) | — | — | — | — | — | — | — |
| Organic binder $a_3$ (g) | — | — | — | — | — | — | — |
| Monomer (g) | 6.00 | 6.00 | 6.00 | 6.00 | 6.00 | 6.00 | 6.00 |
| Photo-radical generator a (g) | 1.00 | 1.00 | 1.00 | 1.00 | 1.00 | 1.00 | 1.00 |
| Photo-radical generator b (g) | 0.10 | 0.10 | 0.10 | 0.10 | 0.10 | 0.10 | 0.10 |
| Dispersing agent $a_1$ (g) | — | 0.033 | 0.055 | 0.33 | 0.55 | 0.88 | 0.99 |
| Dispersing agent $a_2$ (g) | — | — | — | — | — | — | — |
| Dispersing agent $a_3$ (g) | — | — | — | — | — | — | — |

TABLE 2-continued

|  | Sample 10* | Sample 11* | Sample 12 | Sample 13 | Sample 14 | Sample 15 | Sample 16* |
|---|---|---|---|---|---|---|---|
| Dispersing agent $a_4$ (g) | — | — | — | — | — | — | — |
| Dispersing agent $a_5$ (g) | — | — | — | — | — | — | — |
| Dispersing agent b (g) | — | — | — | — | — | — | — |
| Dispersing agent c (g) | — | — | — | — | — | — | — |
| Organic solvent a (g) | 15.00 | 15.00 | 15.00 | 15.00 | 15.00 | 15.00 | 15.00 |
| Organic solvent b (g) | 15.00 | 15.00 | 15.00 | 15.00 | 15.00 | 15.00 | 15.00 |
| Polyvalent alcohol (g) | 1.00 | 1.00 | 1.00 | 1.00 | 1.00 | 1.00 | 1.00 |
| Ultraviolet absorber (g) | 0.10 | 0.10 | 0.10 | 0.10 | 0.10 | 0.10 | 0.10 |
| Thixotropic agent (g) | 0.50 | 0.50 | 0.50 | 0.50 | 0.50 | 0.50 | 0.50 |
| Powdered glass (g) | 3.40 | 3.40 | 3.40 | 3.40 | 3.40 | 3.40 | 3.40 |
| Pattern residue ratio | 100/100 | 65/100 | 1/100 | 1/100 | 1/100 | 1/100 | 1/100 |
| Pattern defect ratio | 0/100 | 0/100 | 0/100 | 0/100 | 0/100 | 0/100 | 30/100 |

*Out of the ranges of the present invention

As is evident from Tables 1 and 2, the pattern residue ratio is 1% in samples 1 to 3 which contain polycarboxylic acid-based dispersing agents. In samples 6, 7, and which do not contain polycarboxylic acid-based dispersing agents, the pattern residue ratio is 100%.

In samples 1 to 3 which contain polycarboxylic acid-based dispersing agents with a molecular weight of about 1,500 or less, the pattern residue ratio is 1% as is evident from Table 1. In samples 4 and 5 which contain polycarboxylic acid-based dispersing agents with a molecular weight of more than about 1,500, the pattern residue ratios are 88% and 90%, respectively.

As is evident from Table 1, the pattern residue ratio is 1% in samples 1 and 8 which contain organic binders with a molecular weight of about 10,000 or more. In sample 9 which contains the organic binder $a_3$ with a molecular weight of less than about 10,000, although the pattern residue ratio is satisfactory, 38 of the copper patterns lines flowed during development, and even in the patterns which do not flow out, pattern defects are observed in 30 lines of copper patterns.

In samples 12 to 15 which contain about 0.05 to 0.8 parts by weight of the polycarboxylic acid-based dispersing agent relative to 100 parts by weight of the powdered copper, the pattern residue ratio and the pattern defect ratio are 1% and 0%, respectively, as is evident from Table 2. In sample 11 in which the dispersing agent content is less than about 0.05, the pattern residue ratio is 65%. In sample 16 in which the dispersing agent content exceeds about 0.8 parts by weight, the pattern defect ratio is 30%.

As described above, it is possible to suppress the aggregation of powdered base metal because of the action of the polycarboxylic acid-based dispersing agent, and residue after development can be prevented in the photoreactive resin composition of the present invention. Consequently, it is possible to stably form fine thick conductive patterns.

By forming conductive patterns using the photoreactive resin composition of the present invention, it is possible to produce circuit substrates and ceramic multilayer substrates which are suitable for higher wiring density and higher signal transmission speed.

What is claimed is:

1. A photoreactive resin composition comprising:
   a powdered base metal;
   an organic binder;
   a photosensitive organic component; and
   a polycarboxylic acid-based dispersing agent with a molecular weight of about 1,500 or less.

2. A photoreactive resin composition according to claim 1, wherein the molecular weight of the organic binder is about 10,000 or more.

3. A photoreactive resin composition according to claim 2, wherein the polycarboxylic acid-based dispersing agent content is about 0.05 to 0.8 parts by weight relative to 100 parts by weight of the powdered base metal.

4. A photoreactive resin composition according to claim 3, further comprising a polyvalent alcohol and a thixotropic agent.

5. A photoreactive resin composition according to claim 4, wherein the molecular weight of the organic binder is about 60,000 or less.

6. A photoreactive resin composition according to claim 1, wherein the polycarboxylic acid-based dispersing agent content is about 0.05 to 0.8 parts by weight relative to 100 parts by weight of the powdered base metal.

7. A photoreactive resin composition according to claim 1, further comprising a polyvalent alcohol and a thixotropic agent.

8. A photoreactive resin composition according to claim 1, wherein the molecular weight of the organic binder is about 60,000 or less.

* * * * *